(12) United States Patent
Szuba et al.

(10) Patent No.: US 8,129,999 B2
(45) Date of Patent: Mar. 6, 2012

(54) DIELECTRIC BREAKDOWN DETECTOR FOR HEV BATTERY APPLICATION

(75) Inventors: Stefan F. Szuba, Troy, MI (US); Joshua M. Anzicek, Lapeer, MI (US); Robert A. Galvin, Lake Orion, MI (US); John Lieske, Sterling Heights, MI (US); John Theofanopoulos, Sterling Heights, MI (US)

(73) Assignee: Cobasys, LLC, Orion, MI (US)

( * ) Notice: Subject to any disclaimer, the term of this patent is extended or adjusted under 35 U.S.C. 154(b) by 1049 days.

(21) Appl. No.: 12/035,791

(22) Filed: Feb. 22, 2008

(65) Prior Publication Data
US 2009/0212780 A1   Aug. 27, 2009

(51) Int. Cl.
*G01N 27/416* (2006.01)

(52) U.S. Cl. ........ 324/430; 324/426; 324/427; 324/428; 324/429

(58) Field of Classification Search .......... 324/427–430, 324/691, 713
See application file for complete search history.

(56) References Cited

U.S. PATENT DOCUMENTS 6,167,349 A * 12/2000 Alvarez ................. 702/63
2005/0244704 A1* 11/2005 Sloop et al. ............. 429/49

FOREIGN PATENT DOCUMENTS
WO   WO 2007/066911   * 6/2007

OTHER PUBLICATIONS

Burr-Brown Products from Texas Instruments; DCP01B Series; "Miniature, 1W Isolated Unregulated DC/DC Converters"; SBVS012C—Dec. 2000—Revised Aug. 2005; 21 Pages.
International Rectifier; Data Sheet No. PD60233 rev B; IR2277S/IR2177S(PbF); "Phase Current Sensor IC for AC Motor Control"; www.irf.com; Aug. 18, 2005; pp. 1-20.
International Rectifier; Data Sheet No. PD60234 revB; IR22771S/IR21771S(PbF); "Phase Current Sensor IC for AC Motor Control"; www.irf.com; Aug. 18, 2005; pp. 1-16.
National Semicnductor; "LM10 Operational Amplifier and Voltage Reference"; www.national.com; 2004 National Semiconductor Corporation DS005652; pp. 1-25.

* cited by examiner

*Primary Examiner* — Samuel Berhanu
(74) *Attorney, Agent, or Firm* — Harness, Dickey & Pierce, P.L.C.

(57) ABSTRACT

A circuit that indicates an impedance of a battery dielectric includes a signal generator module that flows a first current from a ground to a first terminal of a battery. A sensor circuit generates a signal based on a second current that flows from a second terminal of the battery through a resistance to ground. The second current includes the first current and a third current that flows to ground via an impedance presented by a battery dielectric housing. A signal conversion module generates an output signal based on the signal. The output signal represents the impedance presented by the battery dielectric housing.

26 Claims, 6 Drawing Sheets

DIELECTRIC BREAKDOWN DETECTOR FOR HEV BATTERY APPLICATION

FIELD

The present disclosure relates to detecting an electrolyte leak in a hybrid electric vehicle (HEV) battery system.

BACKGROUND

The background description provided herein is for the purpose of generally presenting the context of the disclosure. Work of the presently named inventor, to the extent it is described in this background section, as well as aspects of the description that may not otherwise qualify as prior art at the time of filing, are neither expressly nor impliedly admitted as prior art against the present disclosure.

HEVs include an electric motor and a traditional internal combustion engine. Power from the electric motor and power from the engine are mechanically and/or electrically combined to propel the vehicle. The electric motor receives some or all of its power from one or more batteries that store energy.

The batteries include a dielectric housing, such as a rugged plastic container, that encloses electrodes which are immersed in an electrolyte. In the prior art, a float switch or other fluid level sensor can indicate whether the electrolyte level is below a predetermined level. When the sensor indicates that the electrolyte level is low, a technician can inspect the dielectric housing and determine whether it is cracked or leaking.

SUMMARY

A circuit that indicates an impedance of a battery dielectric includes a signal generator module that flows a first current from a ground to a first terminal of a battery. A sensor circuit generates a signal based on a second current that flows from a second terminal of the battery through a resistance to ground. The second current includes the first current and a third current that flows to ground via an impedance presented by a battery dielectric housing. A signal conversion module generates an output signal based on the signal. The output signal represents the impedance presented by the battery dielectric housing.

In other features the output signal is one or more of a pulse width modulated signal, a period modulated signal, and a network message. The first current is alternating current. A frequency of the alternating current is between one and two hertz. An amplifier amplifies the signal. An isolated power supply provides power to the amplifier and the signal conversion module. The isolated power supply includes a switching power supply. The signal conversion module includes an analog to digital converter.

A circuit that indicates an impedance of a battery dielectric includes a bias circuit that establishes a bias current through first and second terminals of a battery. A sensor circuit generates a signal based on the bias current and a leakage current that flows through an impedance presented by a dielectric housing of the battery. A signal conversion module generates an output signal based on the signal. The output signal represents the impedance presented by the dielectric housing.

In other features the output signal is one or more of a pulse width modulated signal, a period modulated signal, and a network message. The bias circuit includes a resistor. The sense circuit includes a resistor that conducts the bias current and the leakage current. An amplifier amplifies the signal. An isolated power supply provides power to the amplifier and the signal conversion module. The isolated power supply includes a switching power supply. The signal conversion module includes an analog to digital converter.

A method of indicating an impedance of a battery dielectric includes establishing a bias current through first and second terminals of a battery, generating a signal based on the bias current and a leakage current that flows through an impedance presented by a dielectric housing of the battery, and generating an output signal based on the signal. The output signal represents the impedance presented by the dielectric housing.

In other features the output signal is one or more of a pulse width modulated signal, a period modulated signal, and a network message. Establishing a bias current includes conducting the bias current through a resistor that is connected in series with the battery.

A circuit that indicates an impedance of a battery dielectric includes bias circuit means for establishing a bias current through first and second terminals of a battery, sensor circuit means for generating a signal based on the bias current and a leakage current that flows through an impedance presented by a dielectric housing of the battery, and signal conversion means for generating an output signal based on the signal. The output signal represents the impedance presented by the dielectric housing.

In other features the output signal is one or more of a pulse width modulated signal, a period modulated signal, and a network message. The circuit includes amplifier means for amplifying the signal. The circuit includes isolated power supply means for providing power to the signal conversion module. The power is isolated from the battery. The isolated power supply means includes a switching power supply. The signal conversion means includes analog to digital converter means for generating a digital representation of the signal.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

The following description is merely exemplary in nature and is in no way intended to limit the disclosure, its application, or uses. For purposes of clarity, the same reference numbers will be used in the drawings to identify similar elements. As used herein, the term module, circuit, and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

Figure 1:
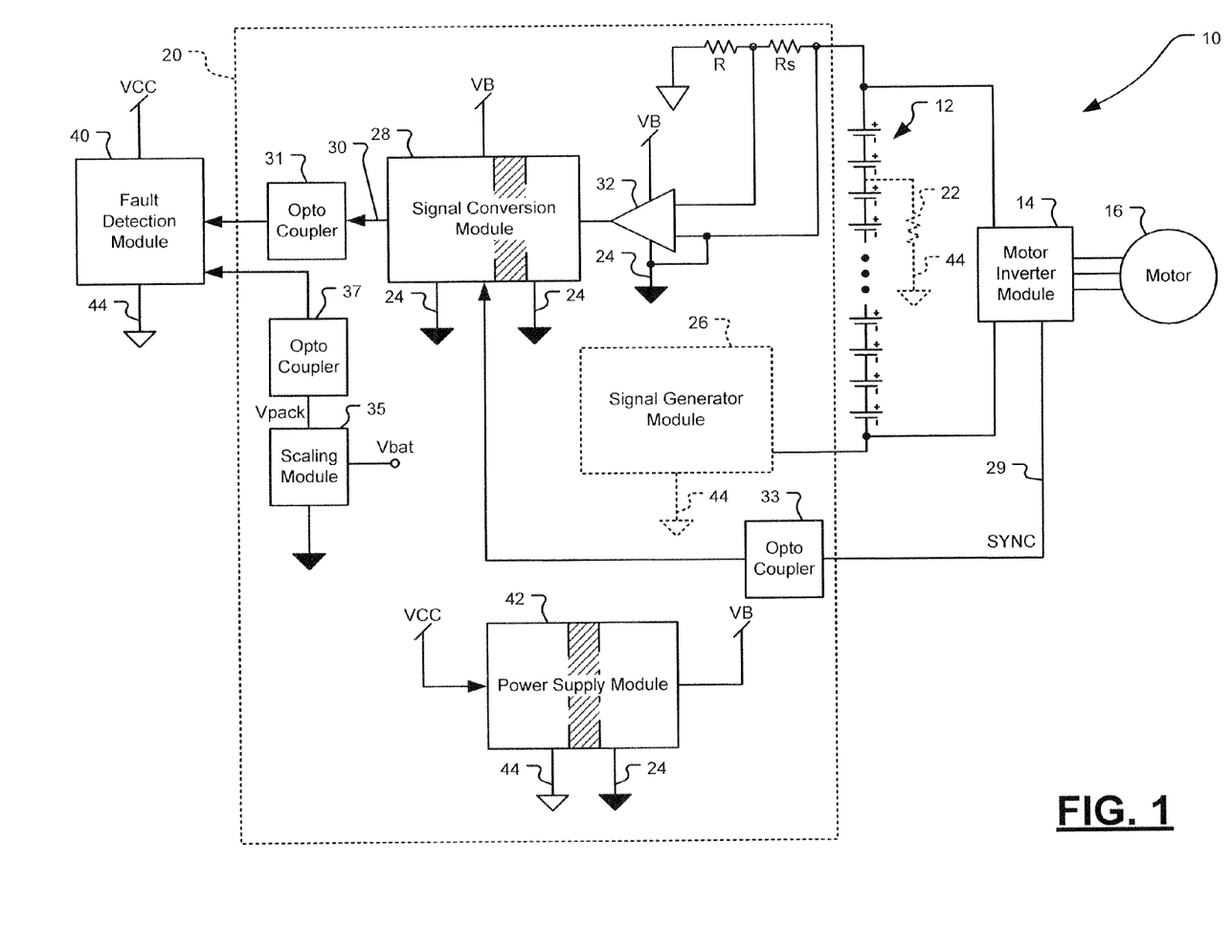
FIG. 1 is a functional block diagram of an electric motor propulsion system that includes a dielectric breakdown detection module.

Referring now to FIG. 1, a functional block diagram is shown of an electric propulsion system 10. Propulsion system 10 can be included in a hybrid electric vehicle. A battery 12 provides electric current to a motor inverter module 14. Battery 12 includes one or more dielectric housings that contain an electrolyte. Motor inverter module 14 converts the electric current to a power format that is compatible with an electric motor 16. Examples of power formats include multiphase alternating current (AC), pulse width modulation (PWM), and the like. Motor 16 can also be driven as a generator, such as when the hybrid electric vehicle is braking. The generated power can be used to recharge battery 12.

A dielectric breakdown detection module 20 provides an output signal 30. Output signal 30 represents an electrical impedance of the dielectric housing of battery 12. An intact dielectric housing may have a higher electrical impedance than a leaking dielectric housing. The impedance is modeled as a leakage impedance 22 which connects between ground 24 and battery 12. In some embodiments leakage impedance 22 varies based on the battery voltage, such as 500 ohms/volt. Opto-couplers and/or transformers electrically isolate or "float" dielectric breakdown detection module 20 from battery 12. The isolation prevents dielectric module 20 from flowing current in parallel with leakage impedance 22 and undesirably reducing a signal to noise ratio of current through leakage impedance 22.

Dielectric breakdown detection module 20 can include a signal generator module 26 that flows an alternating or direct current through battery 12. A sense element, such as sense resistor Rs, develops a signal voltage based on the current. It should be appreciated that Rs may also be implemented with a current probe. An amplitude of the signal voltage decreases when some of the current flows to ground 44 through leakage impedance 22.

A signal conversion module 28 generates output signal 30. Output signal 30 carries information that is based on the signal voltage across sense resistor Rs. In some embodiments the signal voltage can be amplified and/or buffered by an amplifier 32. In some embodiments output signal 30 communicates through an opto-coupler 31. Output signal 30 can be in any digital format, such as pulse width modulated (PWM), pulse period modulated (PPM), pulse amplitude modulated (PAM), network message, etc. The format can be selected based on input requirements of a fault detection module 40. The format can also be chosen based on signal noise and/or direct current (DC) offset conditions in a communication channel employed by output signal 30.

Signal conversion module 28 can receive a synchronization signal 29 from inverter module 14. In some embodiments synchronization signal 29 communicates through an opto-coupler 33. Synchronization signal 29 provides timing information that is associated with the power that is communicated with motor 16. Signal conversion module 28 can use the timing information to compensate for electrical noise that inverter module 14 and/or motor 16 may generate. An example of timing information includes rising and falling edges of signals that drive high-power transistor switches in motor inverter module 14.

Fault detection module 40 processes output signal 30 to determine whether leakage impedance 22 is greater than a leakage impedance threshold. Examples of processing include at least one of integrating and filtering output signal 30. In some embodiments, fault detection module 40 also receives a second signal that represents the battery voltage. The battery voltage may be employed to calculate the leakage impedance threshold. To generate the battery voltage signal, the actual battery voltage Vbat may be applied to scaling module 35. Scaling module 35 scales Vbat down to a signal level voltage Vpack. that is compatible with fault detection module 40. In some embodiments, scaling module 40 generates a PWM signal that includes a duty cycle. The duty cycle represents Vpack. An opto-coupler 37 may be employed to communicate the signal form scaling module 35 to fault detection module 40.

A power supply module 42 generates a voltage VB, which is referenced to ground 24. Power supply module 42 can be powered by a voltage VCC that is derived from battery 12 and referenced to chassis ground 44 Ground 24 may be floated from vehicle chassis ground 44. Floating ground 24 to can improve signal-to-noise ratios in and/or out of signal conversion module 28. In some embodiments power supply module 42 can be implemented with a voltage multiplier, such as a voltage doubler or tripler. The voltage multiplier can be referenced to the positive terminal of battery 12.

Figure 2:
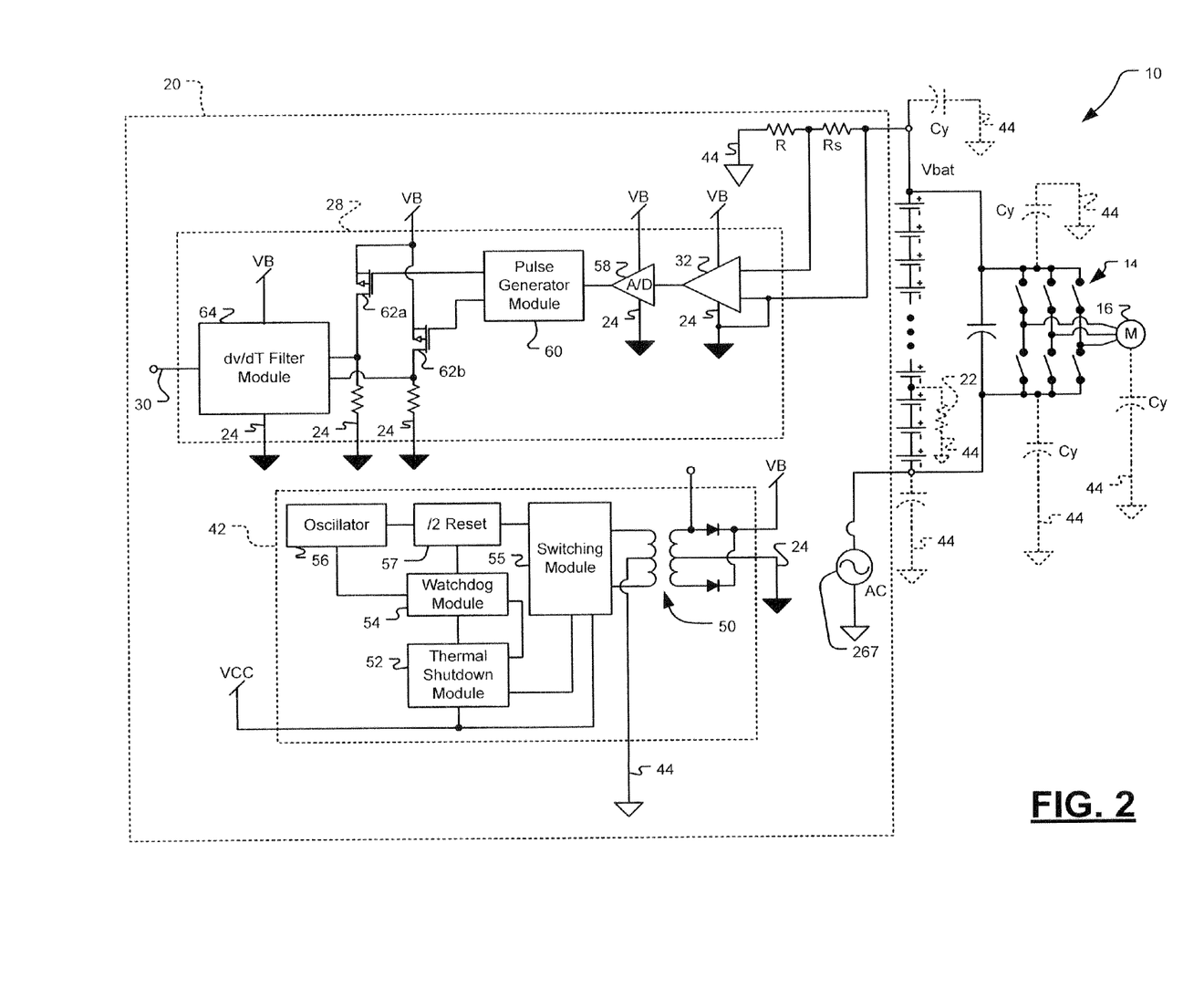
FIG. 2 is a functional block diagram of a first embodiment of the dielectric breakdown detection module of FIG. 1.

Referring now to FIG. 2, a first embodiment is shown of dielectric breakdown detection module 20. Signal generator module 26 generates an alternating current (AC). In some embodiments the AC signal current has a low frequency between 1-2 Hz and amplitude of about five volts. Signal generator module 26 can be implemented with a microprocessor and an associated digital-to-analog converter (DAC). The low frequency causes most of the AC signal current to flow though sense resistor Rs and leakage impedance 22 instead of through parasitic capacitances Cy.

Capacitances Cy are design dependent and can be experimentally determined. In some embodiments capacitances Cy were determined to be less than 10 microfarads. The low frequency signal from signal generator module 26 therefore causes the impedances of capacitors Cy to be in the kilo ohm range. Such high impedances can limit the current sourced by signal generator module 26 to a few milliamperes and the test current through sense resistor Rs to about one milliampere.

The depicted implementation of signal conversion module 28 generates a PWM format at output signal 30. The depicted embodiment employs an integrated circuit (IC) to implement signal conversion module 28, however it should be appreciated that other implementations may be employed.

The depicted IC is an IR2277 available from International Rectifier. The IC converts the voltage across sense resistor Rs Into a time interval. The time interval is level-shifted and fed to the output both as a PWM signal and analog voltage. The analog voltage output is not shown. The analog voltage is proportional to measured voltage drop. The throughput of the IC, e.g. input to output PWM, can support measurements with inverter modules 14 that have switching frequencies as high as 20 kHz.

Amplifier 32 amplifies the voltage appearing across sense resistor Rs. An output of amplifier 32 communicates with an input of an analog to digital (A2D) converter module 58. An output of A2D converter module 58 communicates with an input of a pulse generator module 60. Pulse generator module 60 outputs a series of pulses that have a pulse width based on the output of A2D converter module 58. Transistors 62a and 62b amplify the pulses from pulse generator module 60. The amplified pulses communicate with a dV/dT filter module 64.

dV/dT filter module 64 limits rise and fall times of output signal 30 to limit harmonic interference.

The depicted implementation of power supply module 42 employs an IC. It should be appreciated that other implementations may be employed. The depicted IC is an isolated DC/DC converter that is available from the Burr-Brown Products division of Texas Instruments. The IC includes a power supply thermal shutdown module 52 and a watchdog module 54. Thermal shutdown module 52 turns off or disables power supply module 42 in the event a temperature of power supply module 42 exceeds a predetermined temperature. Watchdog module 54 turns off power supply module 42 in the event an oscillator module 56 stops oscillating. A switching module 55 chops VCC at a frequency that is based on the on the frequency of oscillator module 56 and a divide-by-2 module 57. A transformer 50 isolates the chopped DC power from VB.

Figure 3:
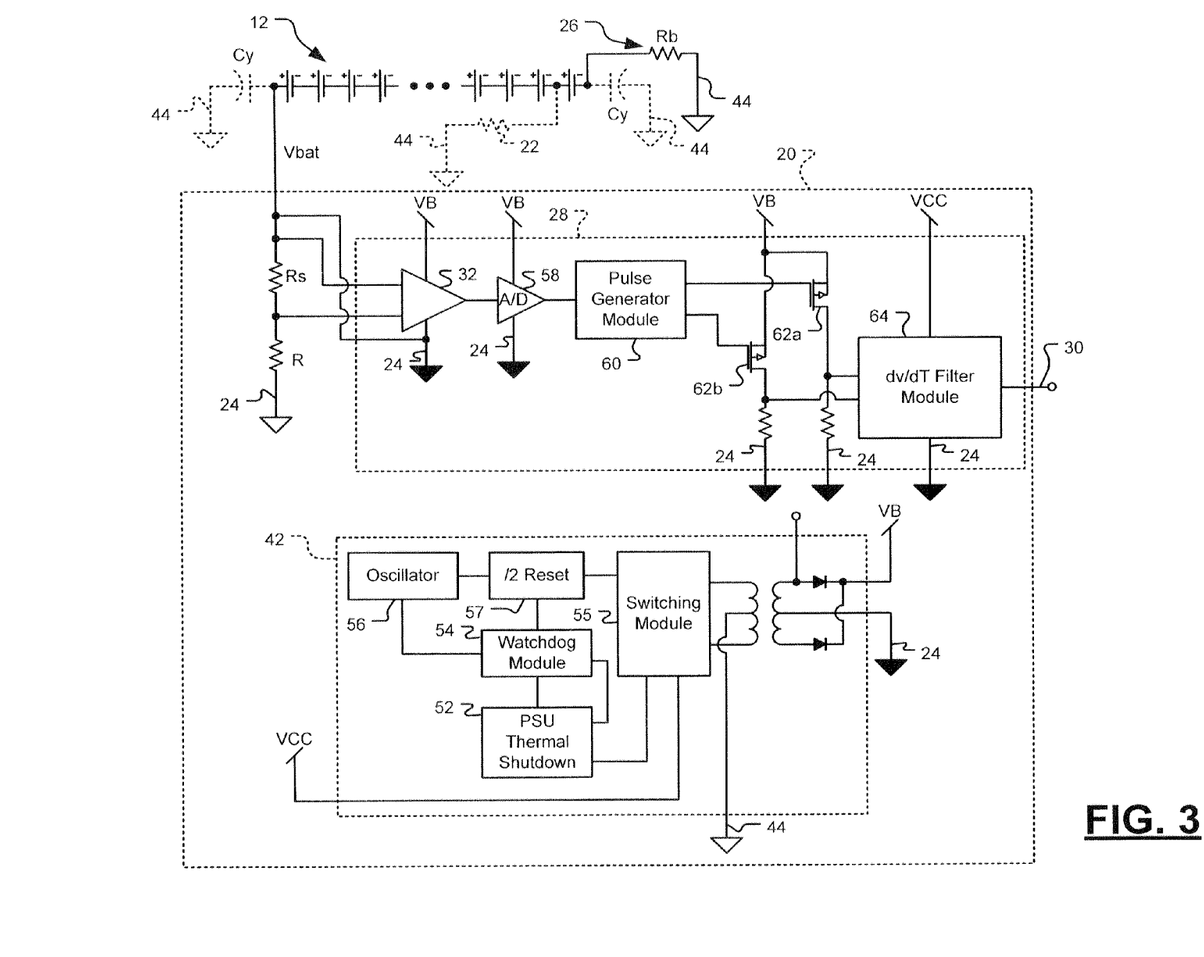
FIG. 3 is a functional block diagram of a second embodiment of the dielectric breakdown detection module of FIG. 1.

Referring now to FIG. 3, a second implementation is shown of dielectric breakdown detection module 20. The second embodiment employs a direct current (DC) sensing method, wherein signal generator module 26 flows a DC bias current. Signal generator module 26 is shown implemented with a bias resistor Rb, however it should be appreciated that a current source may also be employed to establish the bias current. The bias current flows through a series circuit that comprises battery 12, bias resistor Rb, sense resistor Rs, and resistor R. The resistances of bias resistor Rb and resistor R are large with respect to sense resistor Rs. Bias resistor Rb and resistor R therefore effectively establish a bias current level as they swamp out the effect of sense resistor Rs. In some embodiments the values of bias resistor Rb and R are equal. In some embodiments the resistances of bias resistor Rb and resistor R are at least ten times greater that the resistance of sense resistor Rb. Ground 24 may be referenced to the positive terminal of battery 12 to improve the signal-to-noise ratio of the voltage across sense resistor Rs.

The bias current is at a first level while the battery dielectric is intact. If the battery dielectric fails, then leakage impedance 22 decreases passes a greater leakage current. The leakage current flows through sense resistor Rs in addition to the bias current. The increased current through sense resistor Rs and causes the voltage across resistor Rs to increase, thereby indicating that current is leaking through leakage impedance 22. The voltage that is developed across sense resistor Rs can be applied to signal conversion module 28 and represented by output signal 30. Fault detection module 40 processes output signal 30 to determine whether the battery dielectric is intact.

Figure 4:
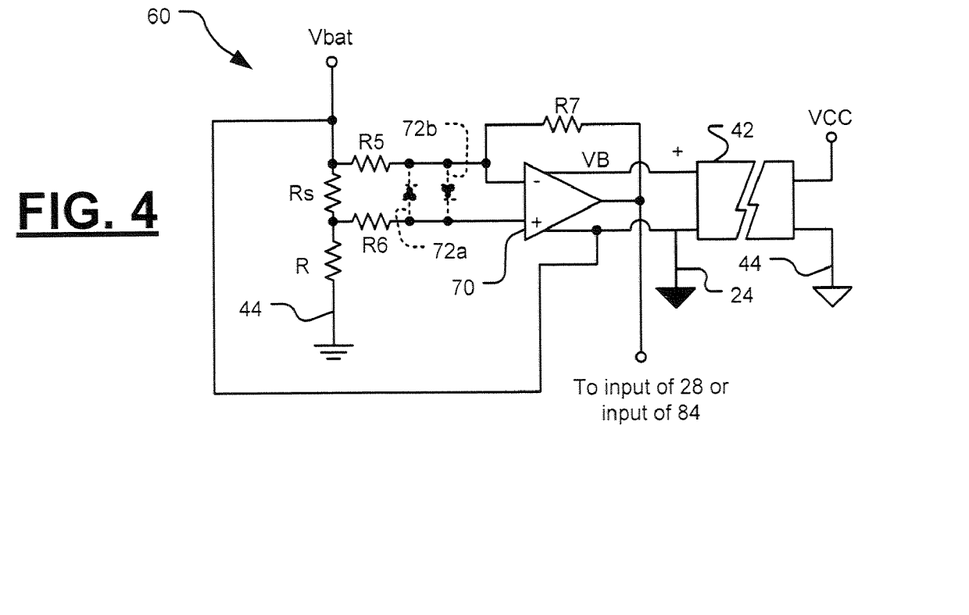
FIG. 4 is a functional block diagram of a signal buffer.

Referring now to FIG. 4, one of several embodiments is shown of an amplifier 60. Amplifier 60 can be employed to amplify the signal from sense resistor Rs before the signal is communicated to signal conversion module 28. A first end of a resistor R5 communicates with a first end of sense resistor Rs. A second end of resistor R5 communicates with an inverting input of an opamp 70. A first end of a resistor R6 communicates with a second end of sense resistor Rs. A second end of resistor R6 communicates with a noninverting input of opamp 70. A first end of a feedback resistor R7 communicates with an output of opamp 70. A second end of feedback resistor R7 communicates with the inverting input of opamp 70. The output of opamp 70 provides an amplified signal that can be applied to the input of signal conversion module 28. Diodes 72a and 72b can be connected across the inverting and non-inverting inputs of opamp 70 to clamp the input voltage to opamp 70. Opamp 70 can be powered by power supply module 42. Ground 24 may be referenced to the positive terminal of battery 12 to improve the signal-to-noise ratio of the voltage across sense resistor Rs.

Figure 5:
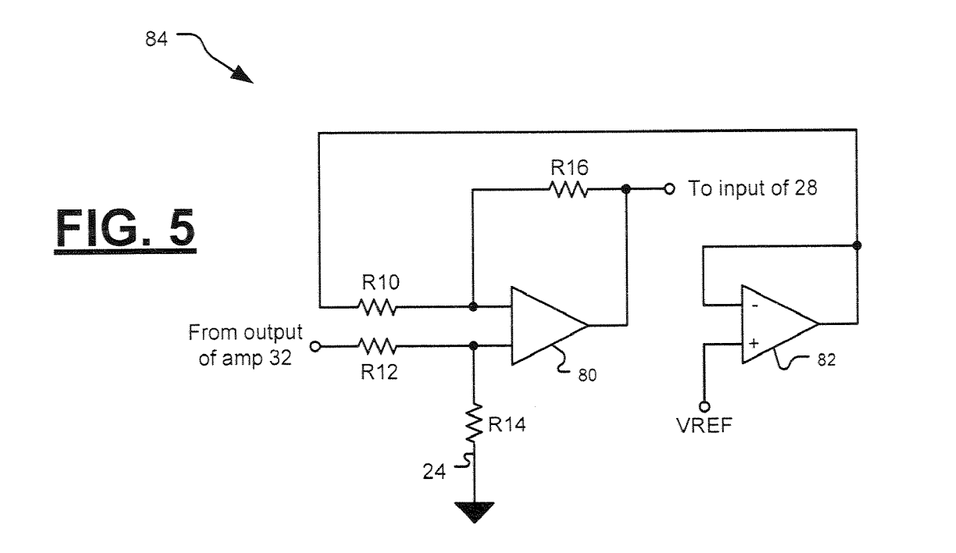
FIG. 5 is a functional block diagram of a non-linear signal amplifier.

Referring now to FIG. 5, a buffer circuit 84 is shown. Buffer circuit 84 can be employed to buffer the signal between amplifier 60 (shown in FIG. 4) and signal conversion module 28. Buffer circuit 84 includes an opamp 80 and a reference amp 82. A first input of reference amp 82 receives a reference voltage VREF. In some embodiments the reference voltage is about 200 millivolts, ±5 millivolts. An output of reference amp 82 feeds back to a second input of reference amp 82. The output of reference amp 82 also communicates with one end of a resistor R10. A second end of resistor R10 communicates with one input of opamp 80. The output signal from amplifier 32 can be applied to one end of a resistor R12. A second end of resistor R12 communicates with a second input of opamp 80 and one end of a resistor R14. The other end of resistor R14 communicates with vehicle chassis ground 44. A feedback resistor R16 communicates with an output of opamp 80 and the first input of opamp 80. The output of opamp 80 also communicates with the input of signal conversion module 28.

Figure 6A:
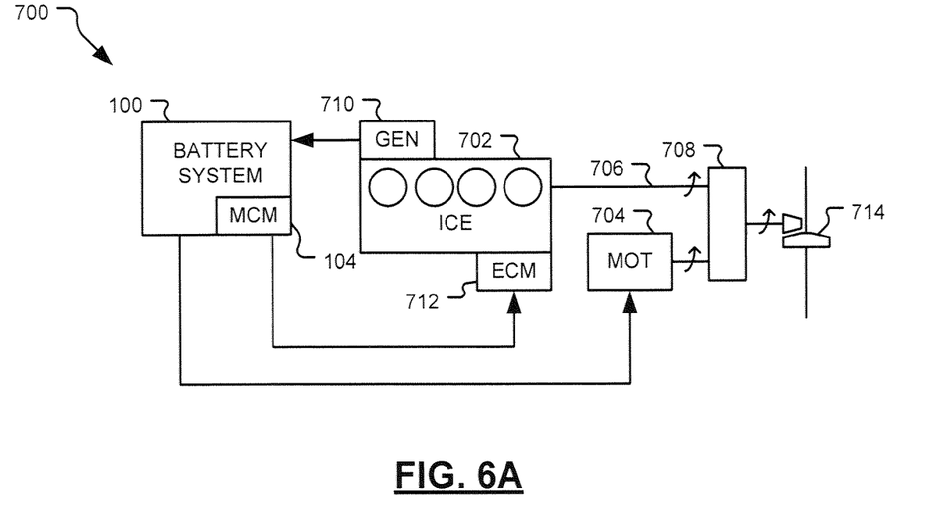
FIGS. 6A-6C are functional block diagrams of hybrid electric vehicle powertrains.
Figure 6B:
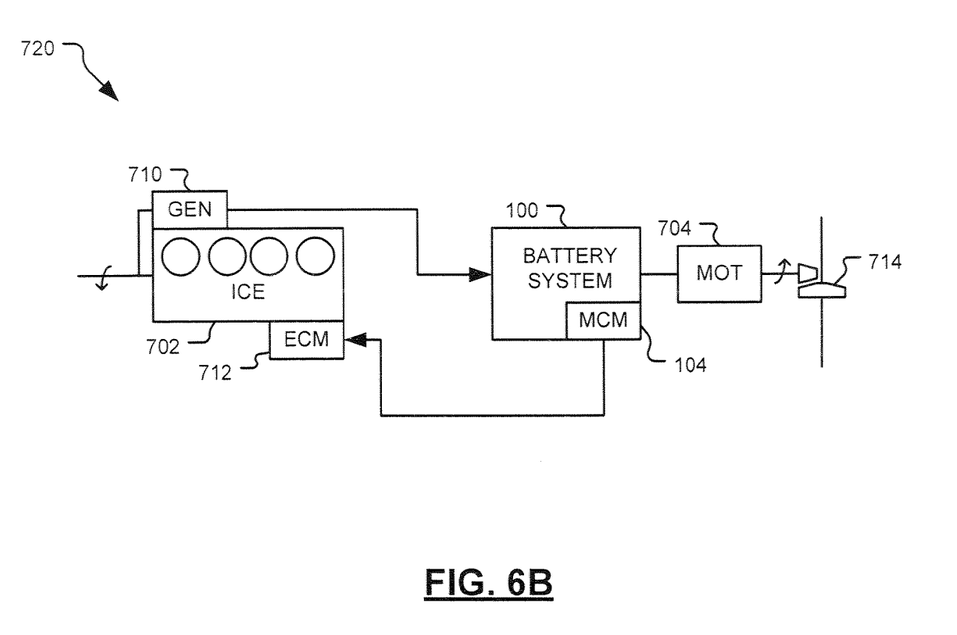
Figure 6C:
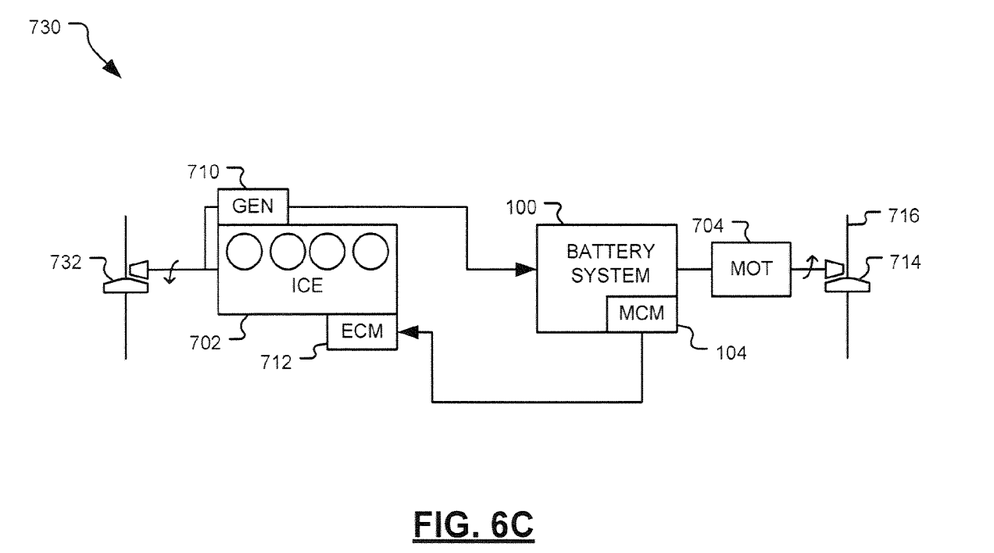

Referring now to FIGS. 6A-6C, various embodiments of hybrid electric vehicles (HEV) are shown. The various embodiments of dielectric breakdown detection module 20 that are described above can be included in a battery system 100. Battery system 100 includes a master control module (MCM) 104 and is incorporated in the HEVs. MCM 104 estimates the state of charge of the batteries in battery system 100.

FIG. 6A depicts a functional block diagram of a parallel-architecture HEV 700. HEV 700 includes an internal combustion engine 702 and an electric motor 704, internal combustion engine 702 includes an output shaft 706 that provides rotational power to a transmission 708. A generator 710 is driven by internal combustion engine 702 and provides a charging current to battery system 100. MCM 104 controls and/or sends a control signal to an electronic control module (ECM) 712. ECM 712 controls internal combustion engine 702 based on the control signal from MCM 104.

Electric motor 704 converts power from battery system 200 to mechanical power. The mechanical power is applied to an input shaft of transmission 708. Transmission 708 combines power from internal combustion engine 702 and electric motor 704 to provide power to a drive axle 714.

Referring now to FIG. 6B, a functional block diagram of a serial-architecture HEV 720 is shown. HEV 720 includes internal combustion engine 702 that drives generator 710. Generator 710 provides charging current to battery system 100. MCM 104 generates a control signal that is communicated to ECM 712. Electric motor 704 receives power from battery system 200.

Referring now to FIG. 6C, a functional block diagram of an indirect serial-architecture HEV 750 is shown. Internal combustion engine 702 provides power to a second drive axle 732 and generator 710. Generator 710 provides a charging current to battery system 100. Electric motor 704 provides power to drive axle 714. MCM 104 coordinates operation of internal combustion engine 702 and electric motor 704 to propel the vehicle.

Those skilled in the art can now appreciate from the foregoing description that the broad teachings of the disclosure can be implemented in a variety of forms. Therefore, while this disclosure includes particular examples, the true scope of the disclosure should not be so limited since other modifications with become apparent to the skilled practitioner upon a study of the drawings, the specification and the following claims.

What is claimed is:

1. A circuit that indicates an impedance of a dielectric housing of a battery, comprising:
   a signal generator module that has a first terminal connected to ground and a second terminal that connects to a first terminal of the battery and that flows a first current from ground to the first terminal of the battery;
   a sensor circuit that has a first terminal connected to a second terminal of the battery and a second terminal connected to ground via a resistance connected in series with the sensor circuit and that generates a signal based on a second current that flows from the second terminal of the battery through the second terminal of the battery though the resistance to ground; and
   a signal conversion module that generates an output signal based on the signal, wherein the output signal represents the impedance presented by the dielectric housing; and a fault detection module that receives the output signal and that determines whether the dielectric housing is intact based on whether the impedance of the dielectric hosing is greater than a threshold impedance, wherein the threshold impedance is based on a voltage of the battery.

2. The circuit of claim 1 wherein the output signal is one or more of a pulse width modulated signal, a period modulated signal, and a network message.

3. The circuit of claim 1 wherein the first current is alternating current.

4. The circuit of claim 3 wherein a frequency of the alternating current is between one and two hertz.

5. The circuit of claim 1 further comprising an amplifier that amplifies the output signal.

6. The circuit of claim 5 further comprising an isolated power supply that provides power to the amplifier and the signal conversion module.

7. The circuit of claim 6 wherein the isolated power supply comprises a switching power supply.

8. The circuit of claim 1 wherein the signal conversion module includes an analog to digital converter.

9. A circuit that indicates an impedance of a dielectric housing of a battery, comprising:
   a bias circuit that establishes a bias current through first and second terminals of the battery;
   a sensor circuit that generates a signal based on the bias current and a leakage current that flows through the impedance presented by the dielectric housing of the battery;
   a signal conversion module that generates an output signal based on the signal wherein the output signal represents the impedance presented by the dielectric housing; and
   a fault detection module that receives the output signal and that determines whether the dielectric housing is intact based on whether the impedance of the dielectric housing is greater than a threshold impedance, wherein the threshold impedance is based on a voltage of the battery.

10. The circuit of claim 9 wherein the output signal is one or more of a pulse width modulated signal, a period modulated signal, and a network message.

11. The circuit of claim 9 wherein the bias circuit comprises a resistor.

12. The circuit of claim 9 wherein the sense circuit comprises a resistor that conducts the bias current and the leakage current.

13. The circuit of claim 9 further comprising an amplifier that amplifies the output signal.

14. The circuit of claim 13 further comprising an isolated power supply that provides power to the amplifier and the signal conversion module.

15. The circuit of claim 14 wherein the isolated power supply includes a switching power supply.

16. A method of indicating an impedance of a dielectric housing of a battery, comprising:
   establishing a bias current through first and second terminals of the battery;
   generating a signal based on the bias current and a leakage current that flows through the impedance presented by the dielectric housing of the battery;
   generating an output signal based on the signal wherein the output signal represents the impedance presented by the dielectric housing; and
   determining whether the dielectric housing is intact based on whether the impedance of the dielectric housing is greater than a threshold impedance, wherein the threshold impedance is based on a voltage of the battery.

17. The method of claim 16 wherein the output signal is one or more of a pulse width modulated signal, a period modulated signal, and a network message.

18. The method of claim 16 wherein establishing the bias current includes conducting the bias current through a resistor that is connected in series with the battery.

19. A circuit that indicates an impedance of a dielectric housing of a battery, comprising:
   bias circuit means for establishing a bias current through first and second terminals of the battery;
   sensor circuit means for generating a signal based on the bias current and a leakage current that flows through the impedance presented by the dielectric housing of the battery;
   signal conversion means for generating an output signal based on the signal wherein the output signal represents the impedance presented by the dielectric housing; and
   fault detection means for receiving the output signal and for determining whether the dielectric housing is intact based on the impedance of the dielectric housing is greater than a threshold impedance, wherein the threshold impedance is based on a voltage of the battery.

20. The circuit of claim 19 wherein the output signal is one. or more of a pulse width modulated signal, a period modulated signal, and a network message.

21. The circuit of claim 19 further comprising amplifier means for amplifying the output signal.

22. The circuit of claim 21 further comprising isolated power supply means for providing power to the signal conversion means, wherein the power is isolated from the battery.

23. The circuit of claim 22 wherein the isolated power supply means includes a switching power supply.

24. The circuit of claim 19 wherein the signal conversion means includes analog to digital converter means for generating a digital representation of the output signal.

25. The circuit of claim 1 wherein the sensing circuit includes a sense resistance, and wherein the resistance is multiple times greater than the sense resistance.

26. The circuit of claim 1 further comprising an inverter module that outputs power from the battery to a motor, wherein the signal conversion module compensates for noise generated by the inverter module or the motor based on a synchronization signal received from the inverter module, wherein the synchronization signal includes timing information associated with the power.

* * * * *

UNITED STATES PATENT AND TRADEMARK OFFICE
CERTIFICATE OF CORRECTION

PATENT NO.         : 8,129,999 B2
APPLICATION NO.    : 12/035791
DATED              : March 6, 2012
INVENTOR(S)        : Stefan F. Szuba et al.

It is certified that error appears in the above-identified patent and that said Letters Patent is hereby corrected as shown below:

| | |
|---|---|
| Column 4, Line 11 | Delete "." after "Vpack" |
| Column 4, Line 21 | Delete "to" after "24" |
| Column 4, Line 41 | Delete "capacitors", insert --capacitances-- |
| Column 5, Line 15 | Delete "on the" after "based" |
| Column 5, Line 33 | Delete "that", insert --than-- |
| Column 6, Line 65 | Delete "with", insert --will-- |
| Column 7, Line 22 | Delete "hosing", insert --housing-- |
| Column 8, Line 39 | After "on", insert --whether-- |
| Column 8, Line 42 | Delete "." after "one" |

Signed and Sealed this
First Day of May, 2012

David J. Kappos
*Director of the United States Patent and Trademark Office*